United States Patent
Hsu et al.

(10) Patent No.: US 11,880,236 B2
(45) Date of Patent: Jan. 23, 2024

(54) PORTABLE COMPUTER AND HANDLE

(71) Applicant: GETAC TECHNOLOGY CORPORATION, Taoyuan (TW)

(72) Inventors: Wan-Lin Hsu, Taipei (TW); Juei-Chi Chang, Taipei (TW)

(73) Assignee: GETAC HOLDINGS CORPORATION, Taoyuan (TW)

( * ) Notice: Subject to any disclaimer, the term of this patent is extended or adjusted under 35 U.S.C. 154(b) by 204 days.

(21) Appl. No.: 17/356,363

(22) Filed: Jun. 23, 2021

(65) Prior Publication Data

US 2021/0405697 A1 Dec. 30, 2021

Related U.S. Application Data

(60) Provisional application No. 63/044,125, filed on Jun. 25, 2020.

(30) Foreign Application Priority Data

Jan. 29, 2021 (CN) .......................... 202110125839.8

(51) Int. Cl.
| | | |
|---|---|---|
| G06F 1/16 | (2006.01) | |
| H05K 5/02 | (2006.01) | |
| A45C 13/22 | (2006.01) | |

(52) U.S. Cl.
CPC ............ *G06F 1/1628* (2013.01); *A45C 13/22* (2013.01); *G06F 1/1656* (2013.01); *H05K 5/023* (2013.01)

(58) Field of Classification Search
CPC .... G06F 1/1615; G06F 1/1616; G06F 1/1628; G06F 1/1633; G06F 1/1656; G06F 1/1675; G06F 1/1681
See application file for complete search history.

(56) References Cited

U.S. PATENT DOCUMENTS

| | | | | |
|---|---|---|---|---|
| 3,438,467 A | * | 4/1969 | Milette ................... | A45C 13/26 16/405 |
| 6,032,334 A | * | 3/2000 | Iima ....................... | A45C 13/26 16/444 |
| 6,208,504 B1 | * | 3/2001 | Cho ....................... | G06F 1/1616 361/725 |
| 7,936,562 B2 | * | 5/2011 | Nagamura ............ | G06F 1/1656 16/429 |

(Continued)

FOREIGN PATENT DOCUMENTS

CN       2504674 Y       8/2002

*Primary Examiner* — Anthony Q Edwards
(74) *Attorney, Agent, or Firm* — Cooper Legal Group, LLC

(57) ABSTRACT

A portable computer includes a computer body and a handle. The handle, operable to be located at a closed position and an open position relative to the computer body, includes a body component for holding of a user, a movable member and an auxiliary member. One end of the movable member is pivotally connected to the body component and the other end is pivotally connected to the computer body. The auxiliary component is disposed on one end of the body component, and is abutted against one side of the movable member. During a movement process of the handle between the closed position and the open position, at least a portion of the movable member is kept in contact with the auxiliary member. When the handle is at the closed position and the open position, the auxiliary member and the body component jointly secure the movable member.

16 Claims, 17 Drawing Sheets

(56) References Cited

U.S. PATENT DOCUMENTS

| | | | |
|---|---|---|---|
| 8,453,297 B2* | 6/2013 | Wang | G06F 1/1656 |
| | | | 190/115 |
| 9,471,096 B2* | 10/2016 | Kuo | G06F 1/166 |
| 10,606,311 B2* | 3/2020 | Shindo | G06F 1/1637 |
| 10,976,780 B2* | 4/2021 | Urimoto | G06F 1/166 |
| 11,294,425 B2* | 4/2022 | Hsu | G06F 1/1616 |
| 2004/0027796 A1* | 2/2004 | Shih | G06F 1/1616 |
| | | | 361/679.58 |
| 2006/0104020 A1* | 5/2006 | Fan | G06F 1/1613 |
| | | | 361/679.55 |
| 2010/0045431 A1* | 2/2010 | Nagamura | G06F 1/1684 |
| | | | 726/19 |
| 2011/0317345 A1* | 12/2011 | Huang | H05K 5/023 |
| | | | 361/679.01 |
| 2012/0243152 A1* | 9/2012 | Kawada | G06F 1/1613 |
| | | | 361/679.01 |
| 2017/0293320 A1* | 10/2017 | Shindo | G06F 1/166 |
| 2017/0364124 A1* | 12/2017 | Lee | G06F 1/1656 |
| 2019/0313757 A1* | 10/2019 | Maltais | A45C 13/22 |
| 2019/0350352 A1* | 11/2019 | Chou | A45F 5/102 |
| 2020/0146427 A1* | 5/2020 | Rungsea | A45C 13/30 |
| 2021/0026405 A1* | 1/2021 | Chen | G06F 1/1656 |

\* cited by examiner

PORTABLE COMPUTER AND HANDLE

CROSS-REFERENCE TO RELATED APPLICATIONS

The present application claims the benefit of U.S. Provisional Patent Application No. 63/044,125, filed on Jun. 25, 2020, the disclosure of which is hereby incorporated by reference herein in its entirety. The present application further claims priority to a CN Patent Application No. 202110125839.8, filed on Jan. 29, 2021, the disclosure of which is also hereby incorporated by reference herein in its entirety.

BACKGROUND OF THE INVENTION

Field of the Invention

The present invention relates to a computer and a handle and, more particularly, to a portable computer having a handle and a handle applied to a portable computer.

Description of the Prior Art

In an actual utilization process of a common rugged laptop computer having a handle, an issue of susceptibility to shaking due to an external force occurs when the handle is gathered at a position near the laptop computer.

SUMMARY OF THE INVENTION

The present invention discloses a portable computer and a handle for primarily improving the issue of susceptibility to shaking due to an external force when a handle of a laptop computer is gathered at a position near the laptop computer.

A portable computer disclosed by one embodiment of the present invention includes a computer body and a handle. The handle is operable to be located at a closed position and an open position relative to the computer body, and includes a body component, a movable member and an auxiliary member. The body component is for holding of a user. One end of the movable member is pivotally connected to the body component, and the other end of the movable member is pivotally connected to the computer body. The auxiliary member is disposed between the movable member and the body component, and is abutted against one side of the movable member. During the movement process of the handle between the closed position and the open position, at least a portion of the movable member is kept in contact with the auxiliary member. When the handle is at the closed position and the open position, the auxiliary member and the body component jointly secure the movable member.

Preferably, the auxiliary member has a recessed portion and a gradual portion. When the handle is located at the closed position, a portion of the movable member is correspondingly located at the recessed portion. The thickness of the auxiliary member gradually changes at the gradual portion, and the thickness of the gradual portion of the auxiliary member increases as getting closer to the recessed portion. During the movement process of the handle between the closed position and the open position, the movable member slides at the gradual portion.

Preferably, the auxiliary member further has a platform portion, the thickness of the auxiliary member does not change at the platform portion, the thickness of the platform portion is less than the thickness of the recessed portion at a lowest position, one end of the gradual portion having a larger thickness is connected to the recessed portion, one end of the gradual portion having a smaller thickness is connected to the platform portion, and the thickness of the gradual portion having the smallest thickness is not less than the thickness of the platform portion.

Preferably, the handle includes two movable members and two auxiliary members. The body component includes a handle body and two end caps. The two end caps are detachably disposed on two ends of the handle body, a pivotal structure is formed between the handle body and each of the end caps, one end of the movable member and the pivotal structure are pivotally connected to each other, and each of the end caps is provided with the auxiliary member.

Preferably, each of the end caps includes a hard structure and a flexible structure, each of the auxiliary members is integrally formed at the flexible structure, the flexible structure envelops a portion of the hard structure, and the hardness of the hard structure is more than the hardness of the flexible structure.

A portable computer disclosed by one embodiment of the present invention includes a computer body and a handle. The handle is operable to be located at a closed position and an open position relative to the computer body. The handle includes: a body component, a movable member and an auxiliary member. The body component is for holding of a user. One end of the movable member is pivotally connected to the body component, and the other end of the movable member is pivotally connected to the computer body. The auxiliary member is disposed between the movable member and the computer body, and is abutted against one side of the movable member. During a movement process of the handle between the closed position and the open position, at least a portion of the movable member is kept in contact with the auxiliary member. When the handle is at the closed position and the open position, the auxiliary member and the handle body jointly secure the movable member.

Preferably, the auxiliary member has a recessed portion and a gradual portion. When the handle is located at the closed position, a portion of the movable member is correspondingly located at the recessed portion. The thickness of the auxiliary member gradually changes at the gradual portion, and the thickness of the gradual portion of the auxiliary member increases as getting closer to the recessed portion. During the movement process of the handle between the closed position and the open position, the movable member slides at the gradual portion.

Preferably, the auxiliary member further has a platform portion, the thickness of the auxiliary member does not change at the platform portion, the thickness of the platform portion is less than the thickness of the recessed portion at a lowest position, one end of the gradual portion having a larger thickness is connected to the recessed portion, one end of the gradual portion having a smaller thickness is connected to the platform portion, and the thickness of the gradual portion having the smallest thickness is not less than the thickness of the platform portion.

Preferably, the handle includes two movable members and two auxiliary members. The body component includes a handle body and two end caps. The two end caps are detachably disposed on two ends of the handle body, a pivotal structure is formed between the handle body and each of the end caps, one end of the movable member and the pivotal structure are pivotally connected to each other, and each of the end caps is provided with the auxiliary member.

Preferably, each of the end caps includes a hard structure and a flexible structure, each of the auxiliary members is integrally formed at the flexible structure, the flexible structure envelops a portion of the hard structure, and the hardness of the hard structure is more than the hardness of the flexible structure.

A handle disclosed by one embodiment of the present invention is adapted to be movably mounted to a computer body of a portable computer, and is operable to be located at a closed position and an open position relative to the computer body. The handle includes: a body component, a movable member and an auxiliary member. The body component is for holding of a user. One end of the movable member is pivotally connected to the body component, and the other end of the movable member is pivotally connected to the computer body. The auxiliary member is disposed between the movable member and the body component, and is abutted against one side of the movable member. During a movement process of the handle between the closed position and the open position, at least a portion of the movable member is kept in contact with the auxiliary member. When the handle is at the closed position and the open position, the auxiliary member and the body component jointly secure the movable member.

Preferably, the auxiliary member has a recessed portion and a gradual portion. When the handle is located at the closed position, a portion of the movable member is correspondingly located at the recessed portion. The thickness of the auxiliary member gradually changes at the gradual portion, and the thickness of the gradual portion of the auxiliary member increases as getting closer to the recessed portion. During the movement process of the handle between the closed position and the open position, the movable member slides at the gradual portion.

Preferably, the auxiliary member further has a platform portion, the thickness of the auxiliary member does not change at the platform portion, the thickness of the platform portion is less than the thickness of the recessed portion at a lowest position, one end of the gradual portion having a larger thickness is connected to the recessed portion, one end of the gradual portion having a smaller thickness is connected to the platform portion, and the thickness of the gradual portion having the smallest thickness is not less than the thickness of the platform portion.

Preferably, the handle includes two movable members and two auxiliary members. The body component includes a handle body and two end caps. The two end caps are detachably disposed on two ends of the handle body, a pivotal structure is formed between the handle body and each of the end caps, one end of the movable member and the pivotal structure are pivotally connected to each other, and each of the end caps is provided with the auxiliary member.

Preferably, each of the end caps includes a hard structure and a flexible structure, each of the auxiliary members is integrally formed at the flexible structure, the flexible structure envelops a portion of the hard structure, and the hardness of the hard structure is more than the hardness of the flexible structure.

In conclusion of the above, in the portable computer and the handle of the present invention, with the configuration of the auxiliary member, the handle can be secured at all times by the auxiliary member and the body component, so that the issue of susceptibility to shaking of the handle in any state is fundamentally unlikely, thereby effectively improving the issue of susceptibility to shaking of the handle caused by an external force in the prior art.

To better understand the features and technical contents of the present invention, please refer to the detailed description and the accompanying drawings regarding the present invention below. However, it should be understood that the detail description and accompanying drawings are only for illustrating the present invention and are not to be interpreted as limitations to the scope of protection of the present invention.

DETAILED DESCRIPTION OF THE EMBODIMENTS

In the description below, if reference is made to a specific drawing or as shown by a specific drawing, such is for emphasizing that the associated contents mostly appear in the specific drawing but does not limit that reference can only be made to the specific drawing in the subsequent description.

Figure 1:
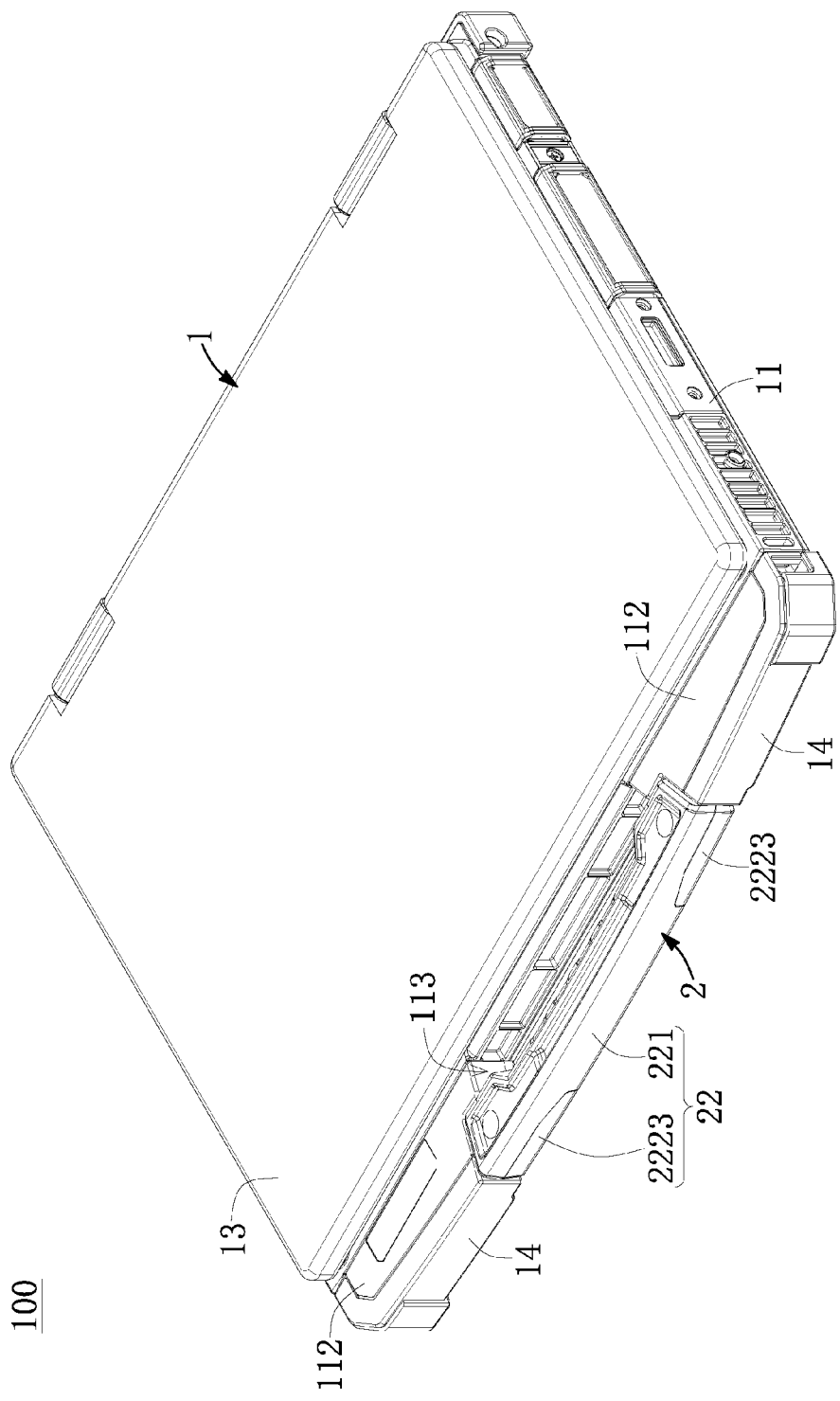
FIG. 1 is a schematic diagram of a portable computer of the present invention.
Figure 2:
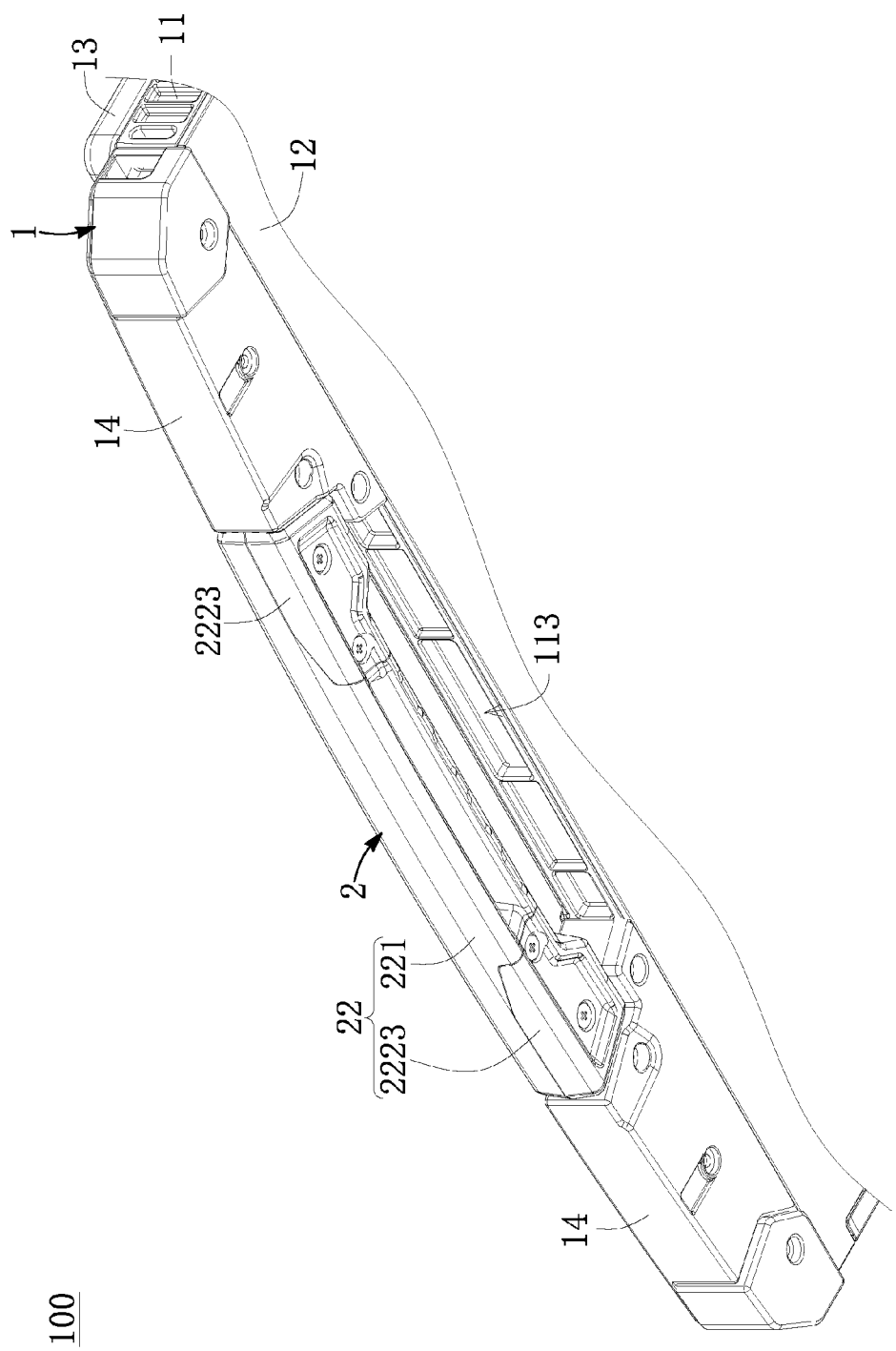
FIG. 2 is a partial enlarged schematic diagram of a portable computer of the present invention.
Figure 3:
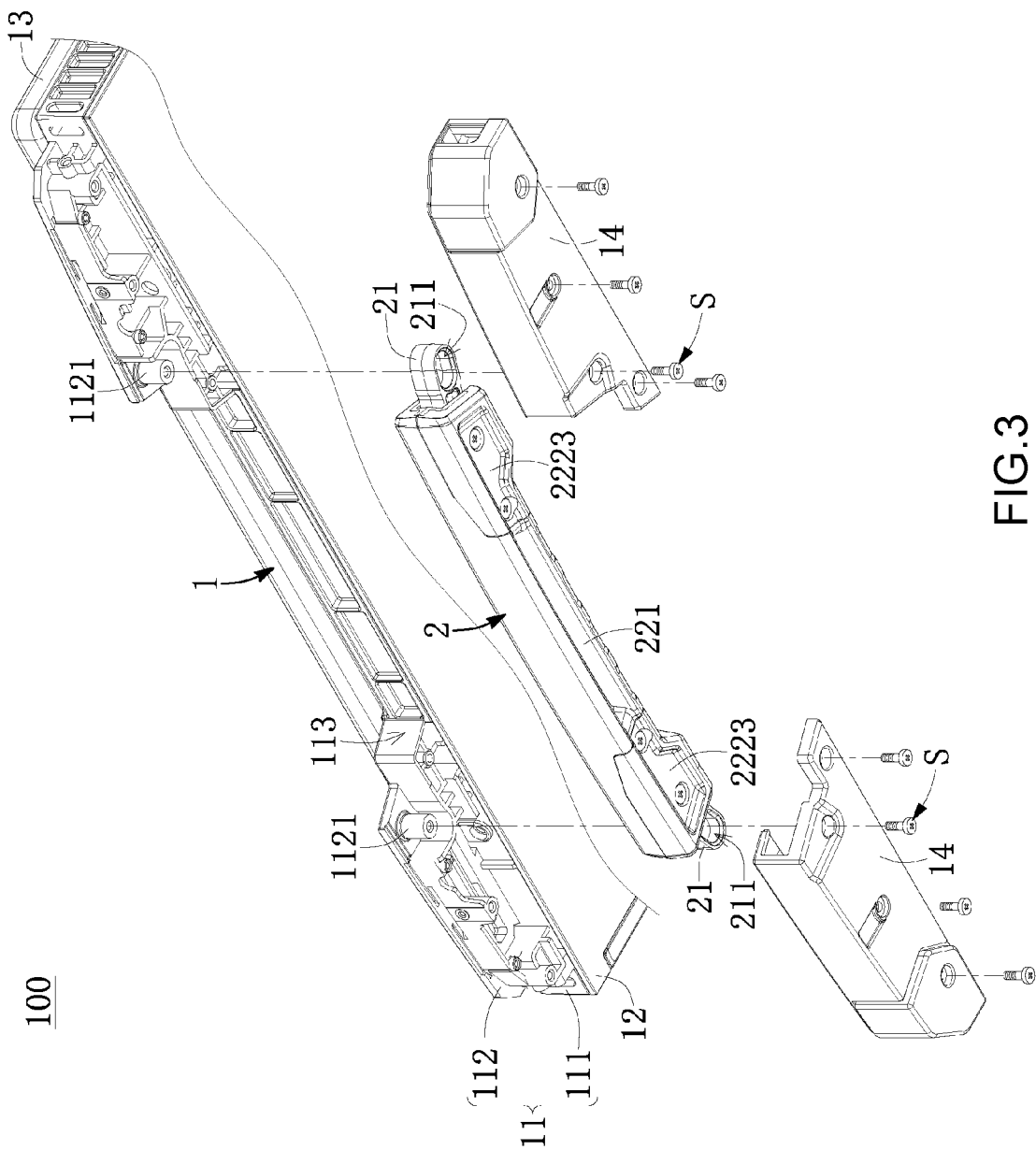
FIG. 3 and FIG. 4 are partial exploded schematic diagrams of a portable computer of the present invention observed from different angles of view.
Figure 4:
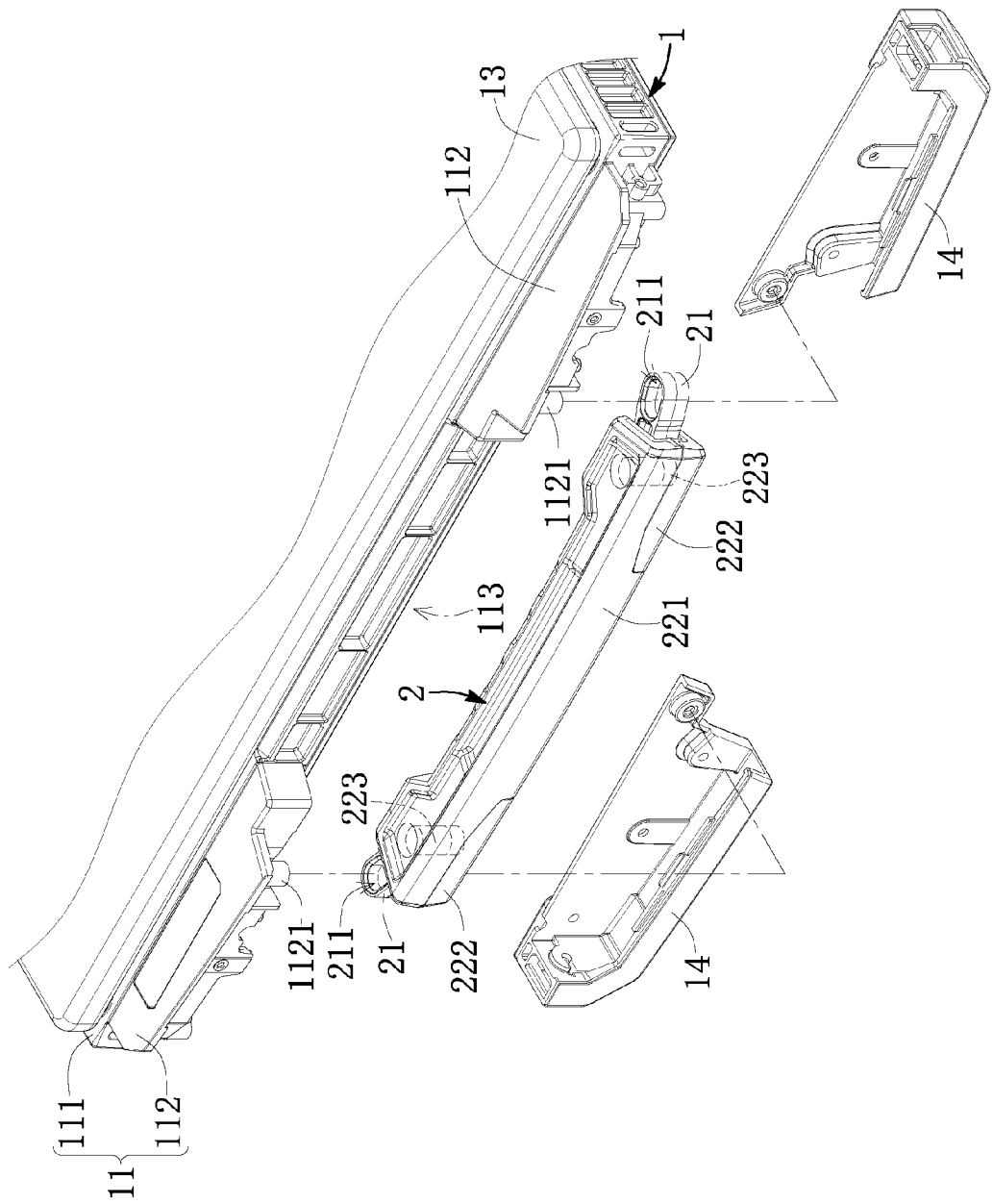

Refer to FIG. 1 to FIG. 4. FIG. 1 shows a schematic diagram of a portable computer of the present invention. FIG. 2 shows a partial enlarged schematic diagram of a portable computer of the present invention. FIG. 3 and FIG. 4 show partial exploded schematic diagrams of a portable computer of the present invention observed from different angles of view. A portable computer 100 of the present invention is preferably applied as, for example but not limited to, a rugged laptop computer.

The portable computer 100 includes a computer body 1 and a handle 2. The computer body 1 may include a host body 11, a bottom shell 12, a screen 13 and two host shells 14. The host body 11 is provided therein with electronic components such as a circuit motherboard, various electrical connection ports, and various memories (e.g., a hard drive). The host body 11 may further be provided with components such as a keyboard and a touch pad. The bottom shell 12 are detachably fixed on one side of the host body 11. When the bottom shell 12 is detached from the host body 11, electronic components such as the circuit motherboard, various electrical connection ports, and various memories disposed in the host body 11 are exposed. The screen 13 is movably disposed on one side of the host body 11. The two host shells 14 are detachably disposed on two corners of the host body 11, and the two host shells 14 match with the host body 11 so that a handle 2 is movably disposed on one side of the host body 11.

Further, the host body 11 has a motherboard portion 111 and two extension portions 112. The motherboard portion 111 extends toward one side to form the two extension portions 112, and the two extension portions 112 and the motherboard portion 111 jointly form a recess 113. The recess 113 is located on one side of the host body 11, and is for accommodating the handle 2. In practice, the motherboard portion 111 and the two extension portions 112 may be an integrally formed structure. The material of the host body 11 may be selected according to requirements; for example, in an embodiment where the portable computer 100 of the present invention is applied as a rugged laptop computer, the host body 11 is, for example, made of an aluminum-magnesium alloy.

Each of the extension portions 112 has a column structure 1121. The host shells 14 can be detachably fixed at the respective extension portions 112 by using a plurality of screws S. When the host shell 14 is fixed at the extension portion 112 by the screws S, the column structure 1121 is abutted against the extension portion 112 to form a pivotal structure of the computer body 1. In a different embodiment, each of the host shells 14 may also have a column structure, and the column structure of the host shell 14 and the column structure 1121 of the extension portion 112 jointly form the pivotal structure of the computer body 1 when the host shell 14 is fixed at the extension portion 112.

Figure 13:
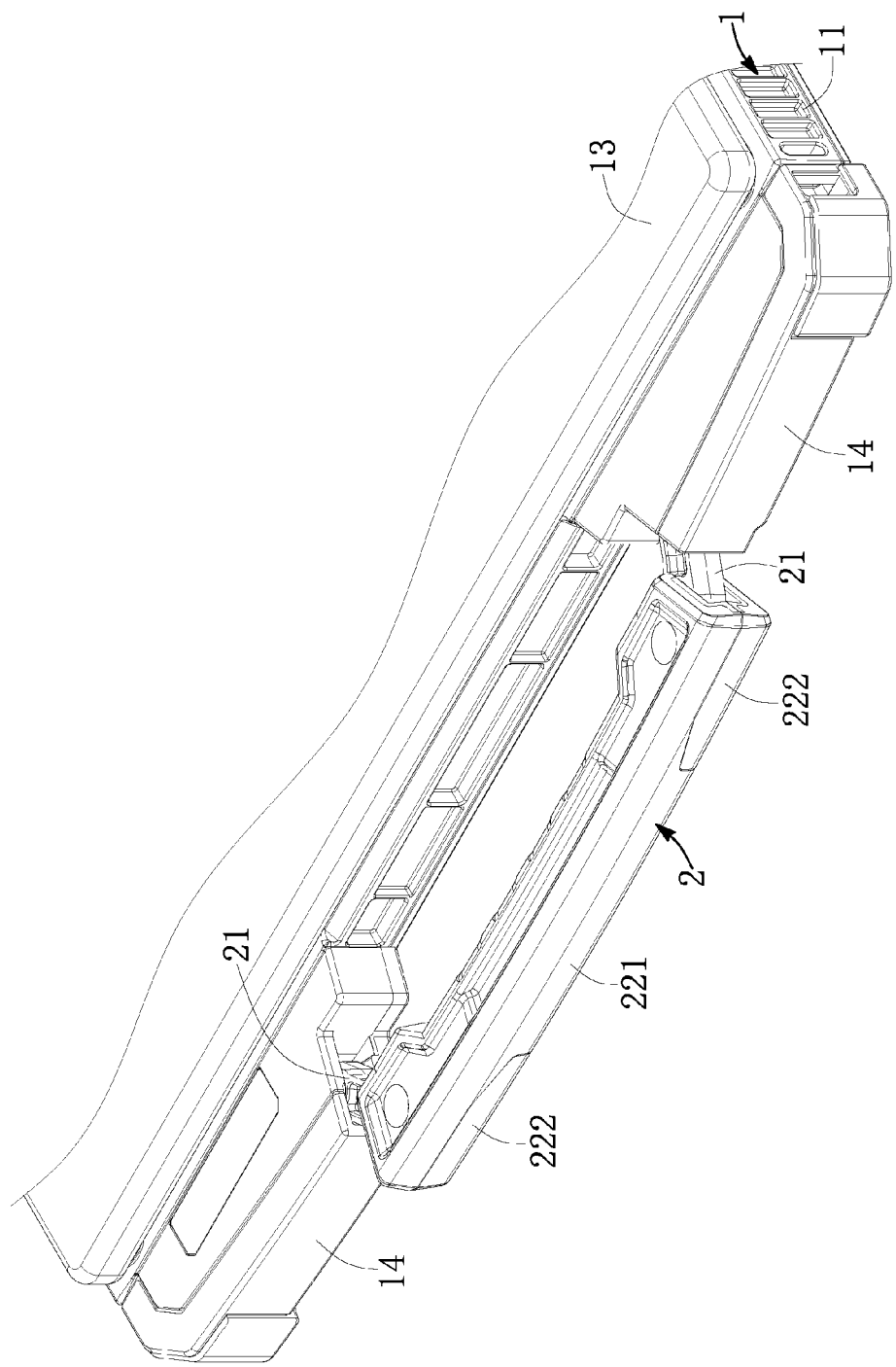
FIG. 13 is a schematic diagram of a handle of a portable computer of the present invention at an open position.
Figure 14:
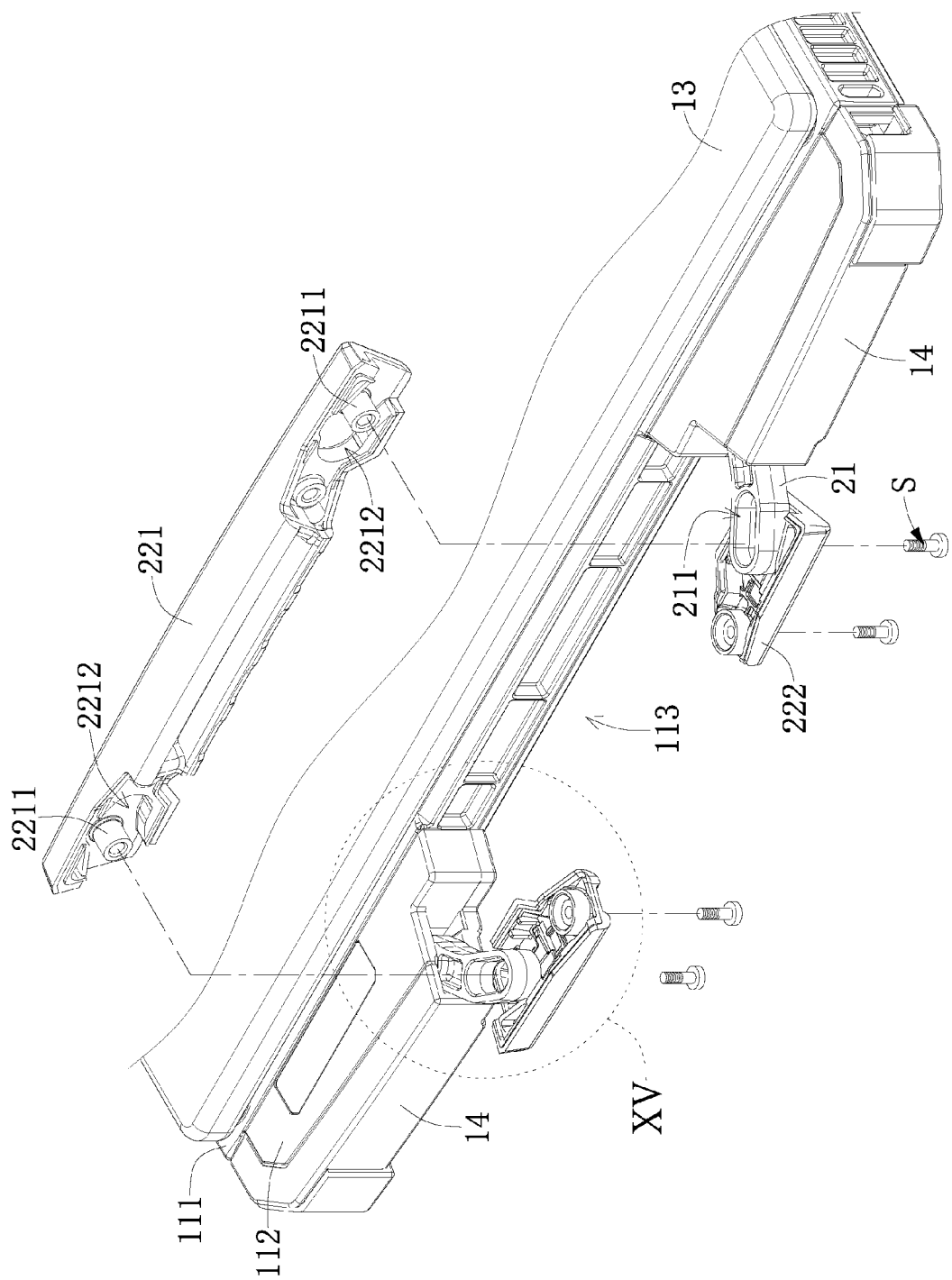
FIG. 14 is a partial exploded schematic diagram of a portable computer of the present invention.
Figure 15:
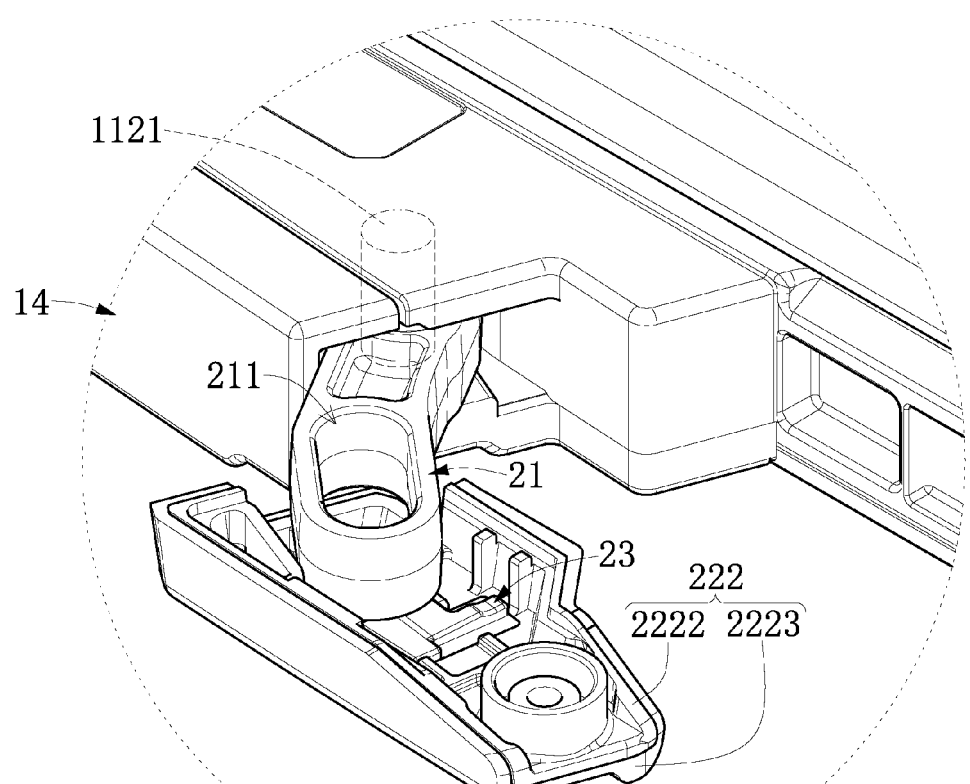
FIG. 15 is a partial enlarged schematic diagram of FIG. 14.

As shown in FIG. 3 to FIG. 6, the handle 2 is operable to be located at a closed position (as shown in FIG. 1) and an open position (as shown in FIG. 13) relative to the computer body 1. The handle 2 includes two movable members 21, a body component 22 and two auxiliary members 23. In this embodiment, the handle 2 has two movable members 21 and two auxiliary members 23 for example; however, the numbers of the movable members 21 and the auxiliary members 23 are not limited thereto. In a different embodiment, the handle 2 may also include only one single movable member 21 and one single auxiliary member 23.

A through hole 211 is formed on each of two ends of each of the movable members 21, and the through holes 211 pass through the movable members 21. One of the through holes 211 of each of the movable members 21 is for sleeving the pivotal structure (formed by the column structure 1121) of the computer body 1, and the other end of each of the movable members 21 is for pivotally connecting to the computer body 1. More specifically, before the host shell 14 is fixed at the extension portion 112 using the screws S, the through hole 211 on one end of the movable member 21 can be sleeved around the column structure 1121 of the extension portion 112, and then the host shell 14 is fixed at the extension portion 112 using the screws S. Thus, the pivotal structure formed by the column structure 1121 correspondingly passes through one of the through holes 211 of the movable member 21. An aperture of the through hole 211 is more than an outer diameter of the column structure 1121. When the handle 2 moves between the closed position and the open position as being subjected to an external force, the column structure 1121 correspondingly moves in the through hole 21.

The body component 22 of the handle 2 may include a handle body 221 and two end caps 222. The handle body 221 is for holding of a user. The appearance and material of the handle body 221 may be changed according to requirements, and are not specifically defined herein. The two end caps 222 are detachably disposed on two ends of the handle body 221. For example, each of the end caps 222 can match with the plurality of screws S, and is thus detachably fixed at the handle body 221.

A pivotal structure 223 is formed between the handle body 221 and each of the end caps 222. Preferably, each of the pivotal structures 223 may appear as a cylindrical structure. More specifically, each of the end caps 222 may have a first column structure 2221, and each of the ends of the handle body 221 may have a second column structure 2211. When each of the end caps 222 is fixed at the handle body 221 using the screws S, the first column structure 2221 and the second column structure 2211 are mutually connected, and the mutually connected first column structure 2221 and second column structure 2211 jointly form the pivotal structure 223 (as shown in FIG. 4).

During an assembly process of the handle 2, a related individual or equipment may first sleeve the through hole 211 of the movable member 21 around the first column structure 2221 or the second column structure 2211, and then use the screws S to fix the end caps 222 at the handle body 221, accordingly correspondingly having the pivotal structure 223 formed by the first column structure 2221 and the second column structure 2211 pass through the through hole 211 of the movable member 21. The aperture of the through hole 211 is more than the outer diameter of the pivotal structure 223; when the handle 2 is subjected to an external force, the pivotal structure 223 moves correspondingly in the through hole 211.

As described above, the two ends of each of the movable members 21 are respectively pivotally connected to the pivotal structure of the computer body 1 and the pivotal structure 223 of the handle body 221 (as shown in FIG. 4). Thus, when the handle body 211 is operated, the body component 22 of the handle 2 is allowed to move between the closed position (as shown in FIG. 1) and the open position (as shown in FIG. 13) relative to the computer body 1 by means of the two movable members 21. In practice, the handle body 221 may further include an accommodating slot 2212, the pivotal structure is correspondingly located in the accommodating slot 2212, and the accommodating slot 2212 accommodates and limits the movement range of the movable member 21.

Figure 5:
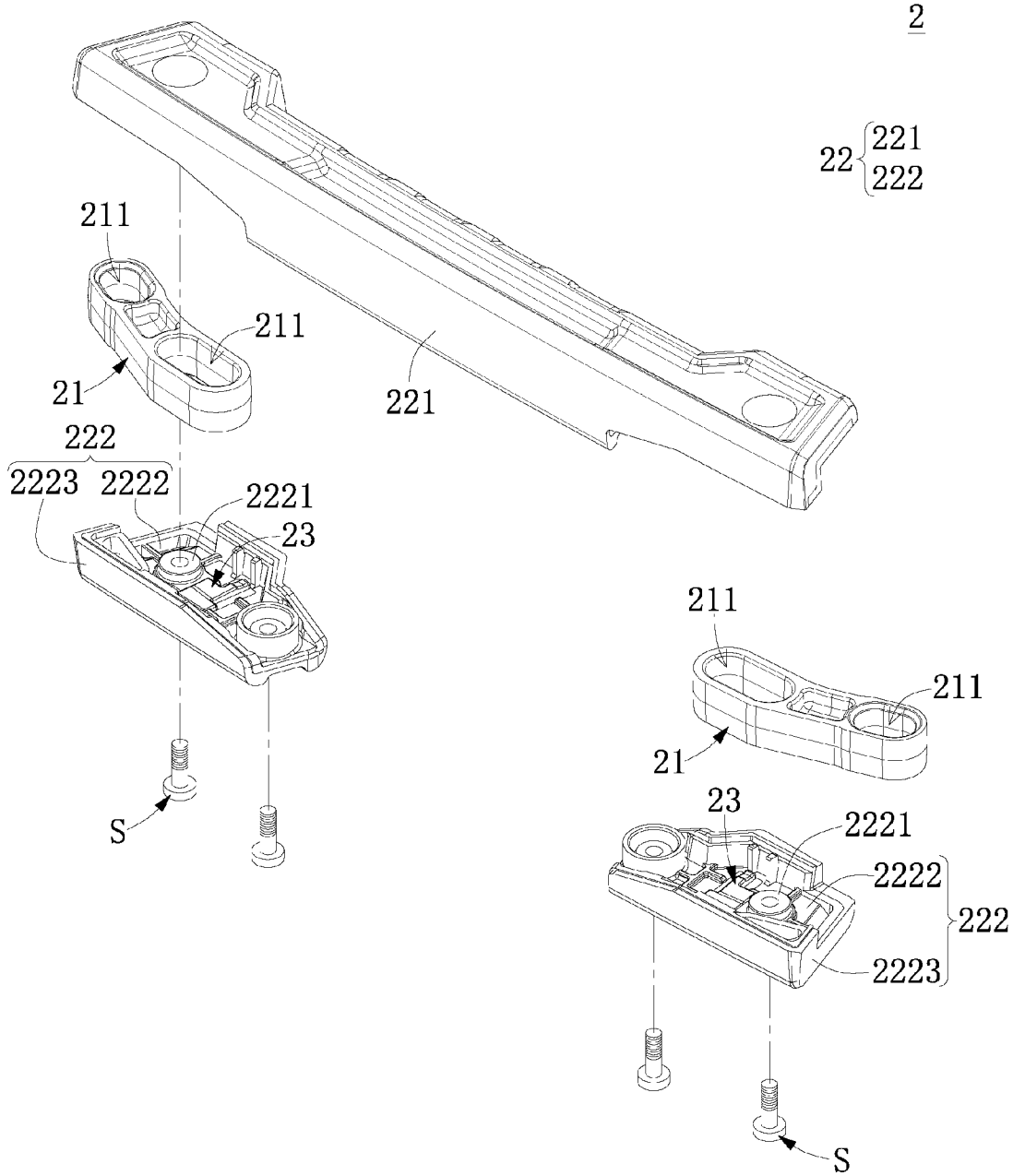
FIG. 5 and FIG. 6 are partial exploded schematic diagrams of a handle of the present invention observed from different angles of view.
Figure 6:
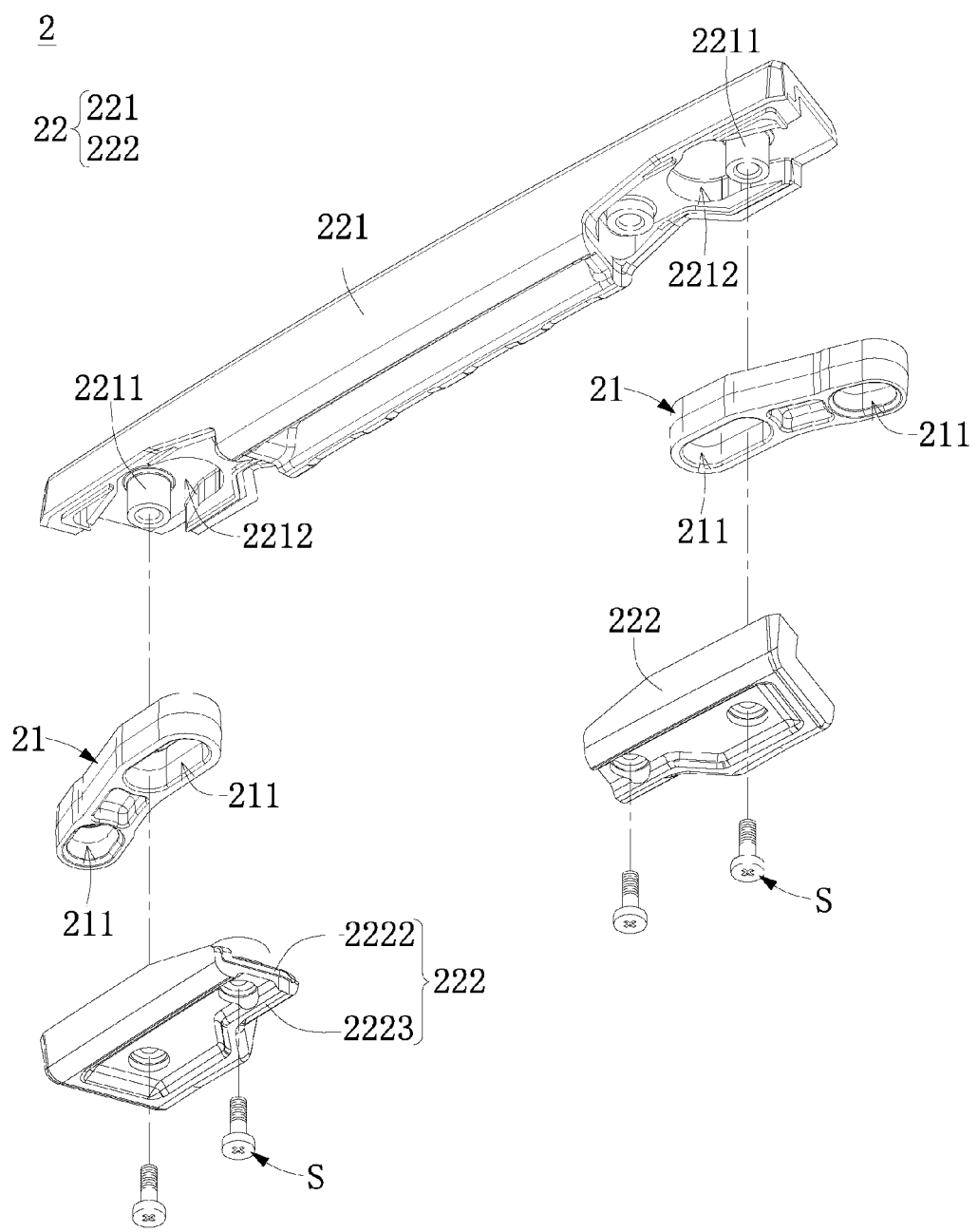
Figure 7:
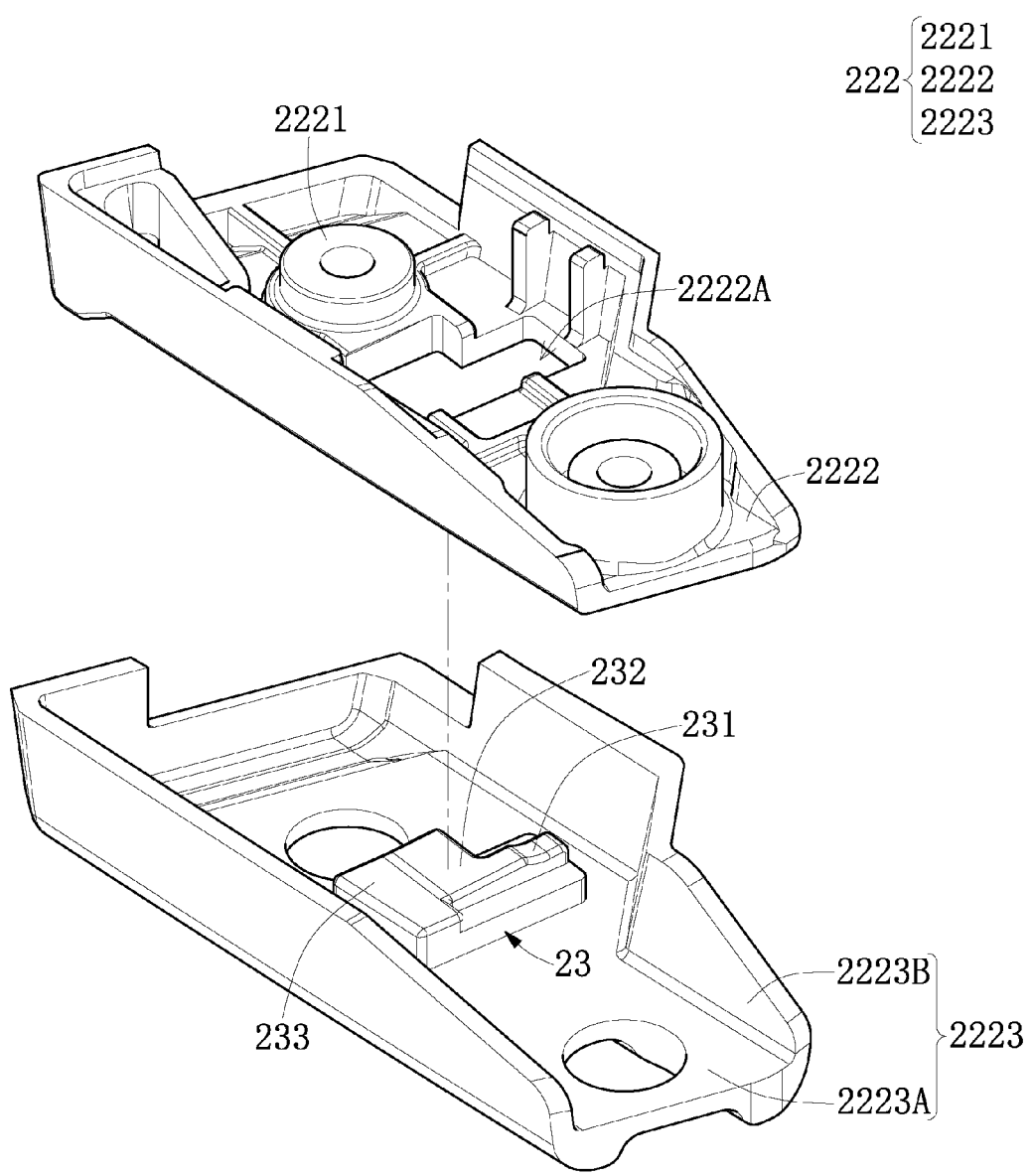
FIG. 7 is an exploded schematic diagram of an end cap and an auxiliary member of a handle of the present invention.
Figure 8:
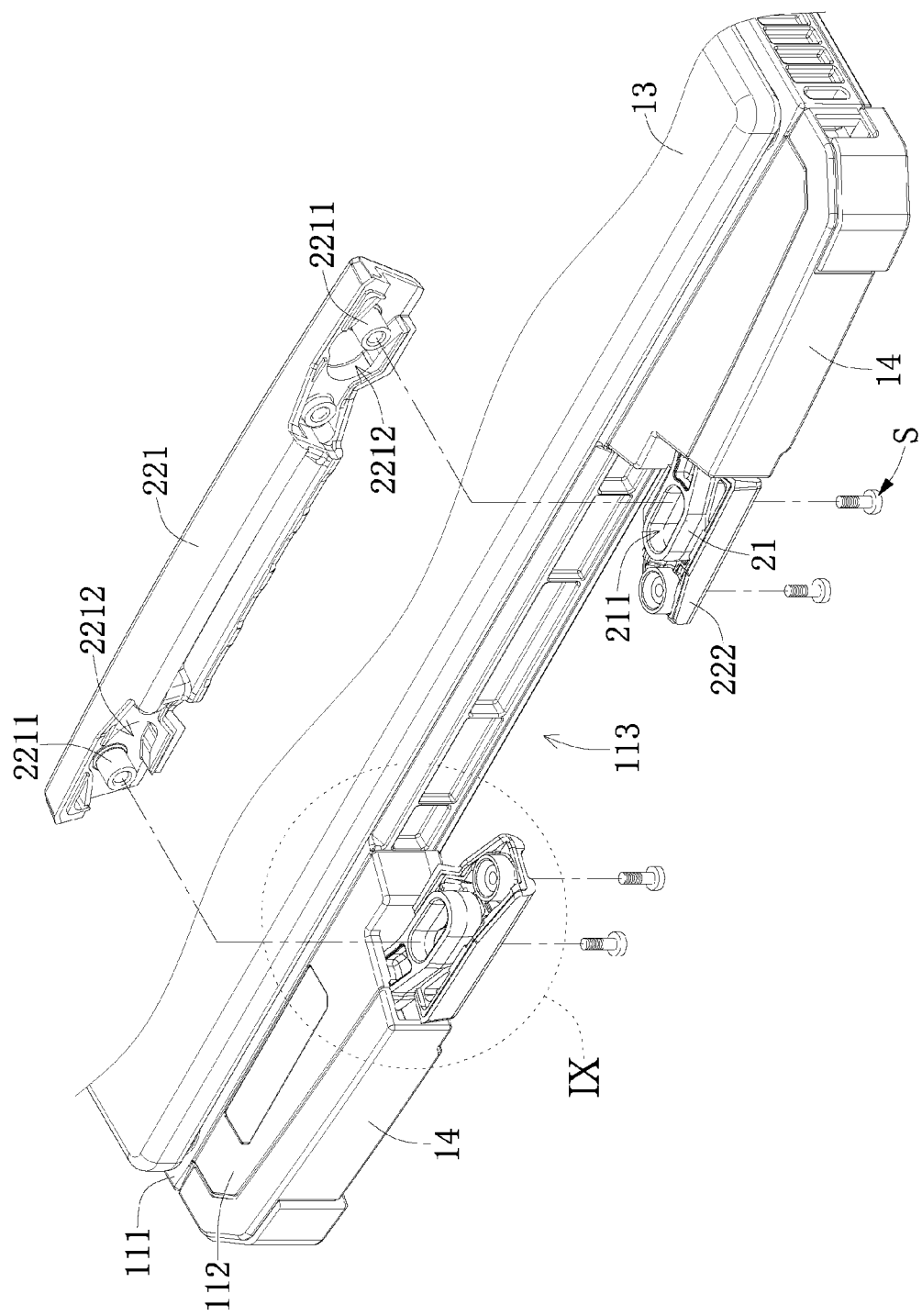
FIG. 8 is a partial exploded schematic diagram of a portable computer of the present invention.
Figure 9:
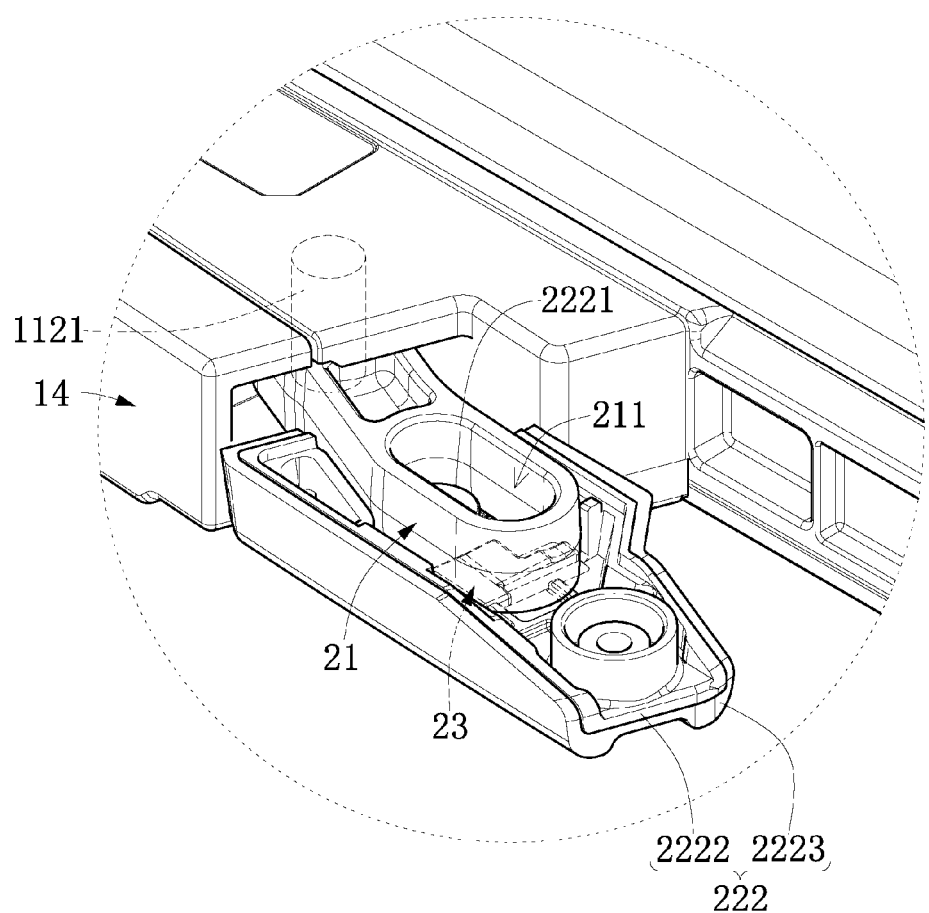
FIG. 9 is a partial enlarged schematic diagram of FIG. 8.
Figure 10:
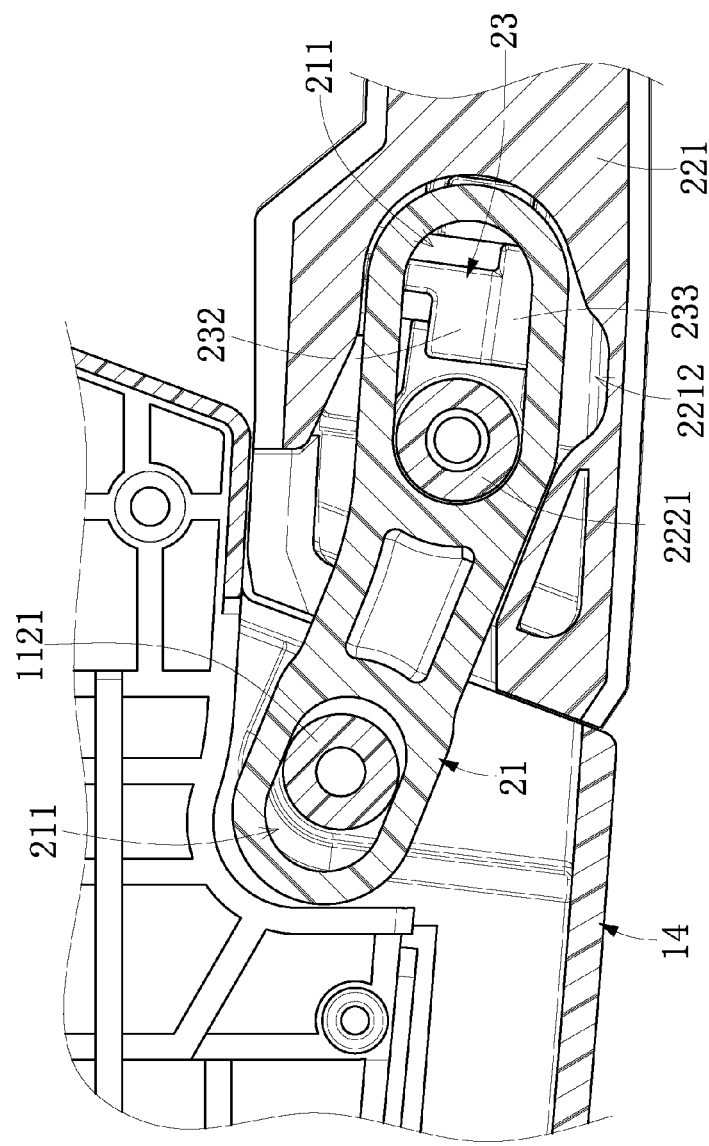
FIG. 10 is a partial cross-sectional schematic diagram of a portable computer of the present invention.
Figure 11:
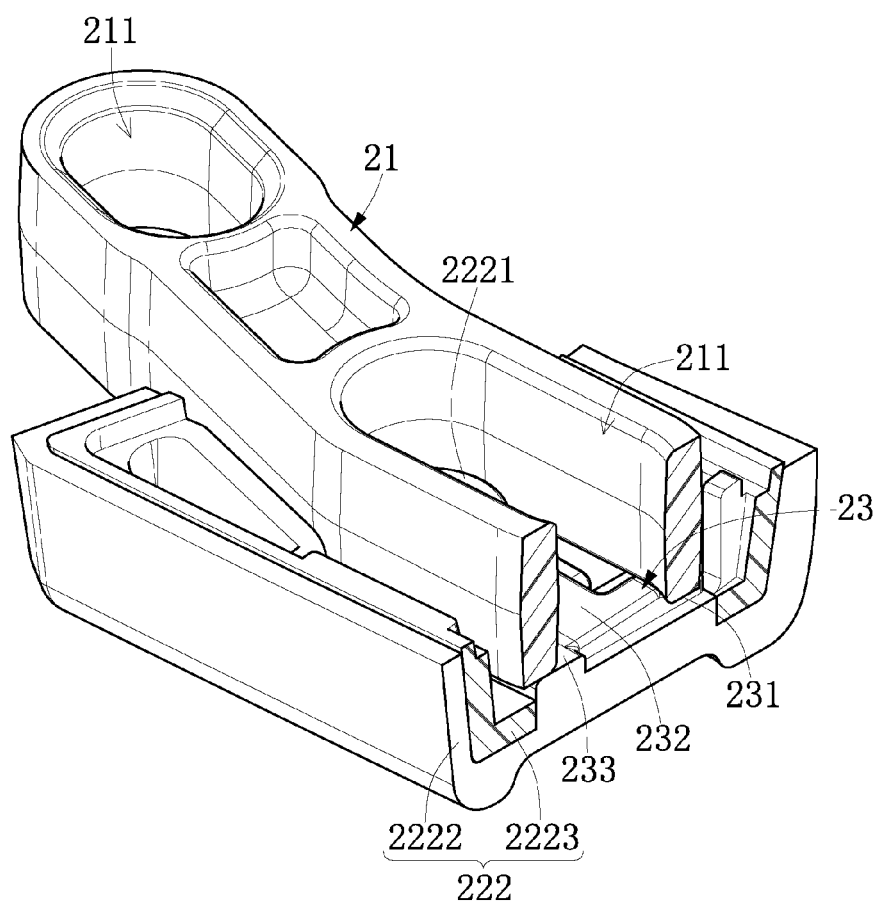
FIG. 11 is a three-dimensional partial cross-sectional schematic diagram of a movable member and an auxiliary member when a handle of a portable computer of the present invention is at a closed position.

As shown in FIG. 5 and FIG. 10, each of the end caps 222 of the handle 2 is provided with one auxiliary member 23. The auxiliary member 23 is abutted against one side of the movable member 21, and is located between the movable member 21 and the body component 22, and the auxiliary member 23 and the body component 22 jointly secure the movable member 21. During the movement process between the closed position (as shown in FIG. 1) and the open position (as shown in FIG. 13) of the handle 2 subjected to an external force, at least a portion of the movable member 21 is kept in contact with the auxiliary member 23. That is to say, the arrangement position and appearance of the auxiliary member 23 are designed according to the appearance of the movable member 21 and the movement range thereof relative to the end cap 222.

With the design of the auxiliary member 23 abutting against one side of the movable member 21 at all times, the handle body 221 is secured by the body component 22 and the auxiliary member 23 at all times, so that the issue of susceptibility to shaking of the handle 2 in any state remains unlikely. Particularly when the handle 2 is at the closed position (as shown in FIG. 1), the issue of susceptibility to shaking of the handle 2 caused by an external force is unlikely, and the handle 2 is maintained in a stable and immobile state.

In practice, each of the end caps 222 may include a hard structure 2222 and a flexible structure 2223. The hardness of the hard structure 2222 is more than the hardness of the flexible structure 2223. For example, the hard structure 2222 is made of various types of engineering plastics, and the flexible structure 2223 is made of flexible materials such as rubber. The hard structure 2222 primarily serves as a main support structure of the end cap 222, and the foregoing first column structure 2221 is formed on an inner side of the hard structure 2222.

The hard structure 2222 may further include openings for the screws S to pass through, and may even further include a yield opening 2222A that is disposed by passing through the hard structure 2222.

The flexible structure 2223 may include a bottom portion 2223A and a sidewall 2223B. The sidewall 2223B is formed at a periphery of the bottom portion 2223A, and one side of the bottom portion 2223A may be integrally provided with one auxiliary member 23. The bottom portion 2223A and the sidewall 2223B jointly envelop the hard structure 2222. When the flexible structure 2223 envelops one side of the hard structure 2222, the auxiliary member 23 formed at the flexible structure 2223 will expose from one side of the hard structure 2222 through the yield opening 2222A. In practice, the hard structure 2222 and the flexible structure 2223 may be made by means of, for example but not limited to, a double injection molding technique.

Referring to FIG. 7 to FIG. 12, in a preferred embodiment, each of the auxiliary members 23 may have a recessed portion 231, a gradual portion 232 and a platform portion 233. The recessed portion 231 may be a substantially arc-shaped groove. Two sides of the gradual portion 232 are respectively connected to the recessed portion 231 and the platform portion 233, and the gradual portion 232 is located between the recessed portion 231 and the platform portion 233.

Figure 12:
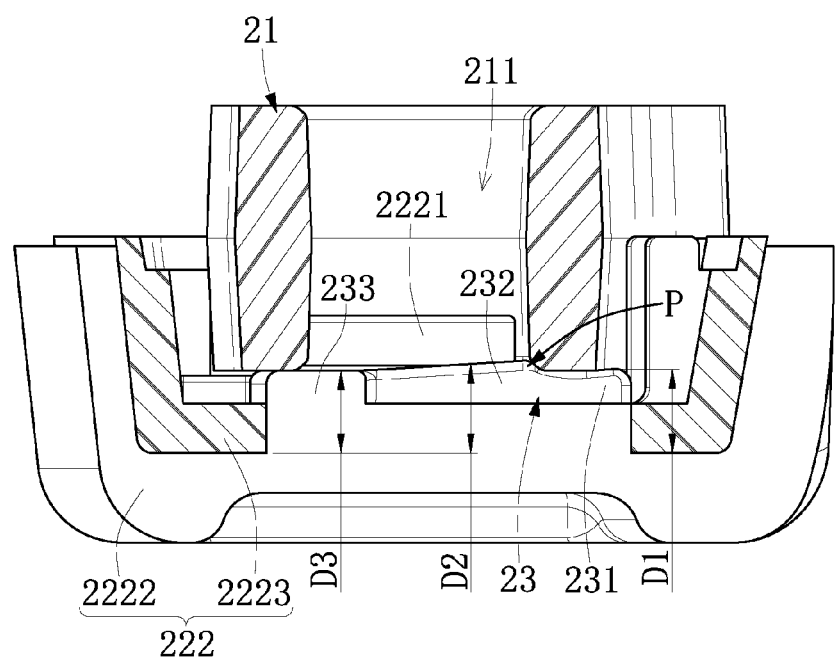
FIG. 12 is a partial cross-sectional schematic diagram of a movable member and an auxiliary member when a handle of a portable computer of the present invention is at a closed position.

A thickness D1 of the recessed portion 231 changes by way of gradually increasing from the middle toward two sides of the recessed portion 231; that is, the thickness at the middle position of the recessed portion 231 is smaller than the thicknesses of the remaining positions of the recessed portion 231. A thickness D2 of the auxiliary member 23 gradually changes at the gradual portion 232, and the thickness of the gradual portion 232 changes by way of increasing as getting closer to the recessed portion 231; that is to say, the thickness of the auxiliary member 23 is largest at a position P (as shown in FIG. 12) at which the recessed portion 231 and the gradual portion 232 are connected, the thickness of the auxiliary member 23 gradually decreases from the position P (as shown in FIG. 12) toward the center position of the recessed portion 232, and the thickness of the auxiliary member 23 also decreases from the position P (as shown in FIG. 12) toward the gradual portion 232 and toward the platform portion 233. A thickness D3 of the auxiliary member 23 at the platform portion 233 does not change, the thickness of the platform portion 233 is less than the thickness of the recessed portion 231 at a lowest position, and the thickness of the gradual portion 232 at a position having the smallest thickness is not less than the thickness of the platform portion 233.

By additionally providing the auxiliary member 23 on a movement path of the movable member 21 to increase the frictional resistance between the movable member 21 and the body component 22, and by adjusting the thickness of the auxiliary member 23, the tolerance fit between the movable member 21 and the body component 22 is changed. In this specific embodiment, the tightness between the movable member 21 and the body component 22 is adjusted as the thickness of the auxiliary member 23 gradually increases, thereby adjusting the clamping force on the movable member 21 and the feel of operation of the handle 2.

Refer to FIG. 1 and FIG. 7 to FIG. 12. FIG. 8 to FIG. 12 show schematic diagrams of relative positions of different components when the handle 2 is located at the closed position, respectively. When the handle 2 is located at the closed position, a portion of the movable member 21 is disposed correspondingly at the recessed portion 231, and a portion (the portion of the position P indicated in FIG. 12) at which the recessed portion 231 and the gradual portion 232 are connected is correspondingly located in the through hole 211 of the movable member 21. Referring to FIG. 13 to FIG. 16 showing schematic diagrams of relative positions of different components when the handle 2 is located at the open position, when the handle 2 is located at the open position, a portion of the movable member 21 is correspondingly located at the gradual portion 232 and the platform portion 233, and the column structure 1121 of the extension portion 112 is correspondingly abutted against one end of the through hole 211 of the movable member 21, and the first column structure 2221 of the end cap 222 is abutted against one end of the other through hole 211 of the movable member 21.

According to the description above, during the movement process of the handle 2 from the closed position (as shown in FIG. 1) to the open position (as shown in FIG. 13) when handle 2 is subjected to an external force, the portion of the movable member 21 originally disposed at a position on the recessed portion 231 farthest away from the gradual portion 232 moves along the recessed portion 231, first moves to the position of the recessed portion 231 having the smallest thickness, then moves to the position of the auxiliary member 23 having the largest thickness (i.e., the position P at which the recessed portion 231 and the gradual portion 232 are connected), and finally moves along the gradual portion 232 to the platform portion 233.

In continuation, with the design of the recessed portion 231, the gradual portion 232 and the platform portion 233, during the process of moving the handle 2 from the closed position to the open position by a user, the user needs to first apply a greater pulling force upon the handle body 221 in order to impel the movable member 21 by the handle body 221, so that the portion of the movable member 21 originally located in the recessed portion 231 can leave the recessed portion 231 and pass through the portion of the auxiliary member 23 having the largest thickness (i.e., the position P at which the recessed portion 231 and the gradual portion 232 are connected). During the process of the movable member 21 passing through the position of the auxiliary member 23 having the largest thickness, the user noticeably feels a sudden difference in height so that it would be obvious to the user that the handle 2 has left the closed position. Once the movable member 21 passes through the position of the auxiliary member 23 having the largest thickness, the movable member 21 moves along the gradual portion 232, and as the thickness of the gradual portion 232 gradually decreases, it would also be obvious to the user that it is no longer necessary to apply the same amount of force and the handle 2 can be driven and moved accordingly.

In contrast, when the user moves the handle 2 from the open position to the closed position, the movable member 21 moves from the platform portion 233 to the gradual portion 232 and then moves from the gradual portion 232 to the recessed portion 231. During the process of the movable member 21 passing through the position P at which the gradual portion 232 and the recessed portion 231 are connected, it would be obvious to the user that a greater amount of force needs to be applied in order to continue moving the handle 2. As the movable member 21 passes through the position P at which the gradual portion 232 and the recessed portion 231 are connected and enters the recessed portion 231, because the thickness of the recessed portion 231 is noticeably less than the thickness of the position P at which the gradual portion 232 and the recessed portion 231 are connected, the user can clearly feel that the movable member 21 has moved into the recessed portion 231.

It should be noted that, in practice, the auxiliary member 23 may be selectively made of a flexible material (e.g., rubber and silicone), and the appearances and thicknesses of the host shell 14, the movable member 21 and the auxiliary member 23 may be appropriately designed, so that a force is applied to the auxiliary member 23 regardless of the state of the movable member 21, and the portion of the auxiliary member 23 pressed by the movable member 21 correspondingly generates an elastic restoring force, thereby ensuring that the issue of shaking remains unlikely when the movable member 21 is under any state.

In conclusion of the above, in the portable computer and the handle of the present invention, with the design of the movable member and the auxiliary member, a user is allowed to clearly feel that the handle has left the closed position and to also clearly feel that the handle is moved to the closed position when the user operates the handle, hence providing the user with good operation experience. Furthermore, in the portable computer and the handle of the present invention, with the design of the auxiliary member, the issue of shaking caused by any slight external force remains unlikely when the handle is at the closed position.

Figure 16:
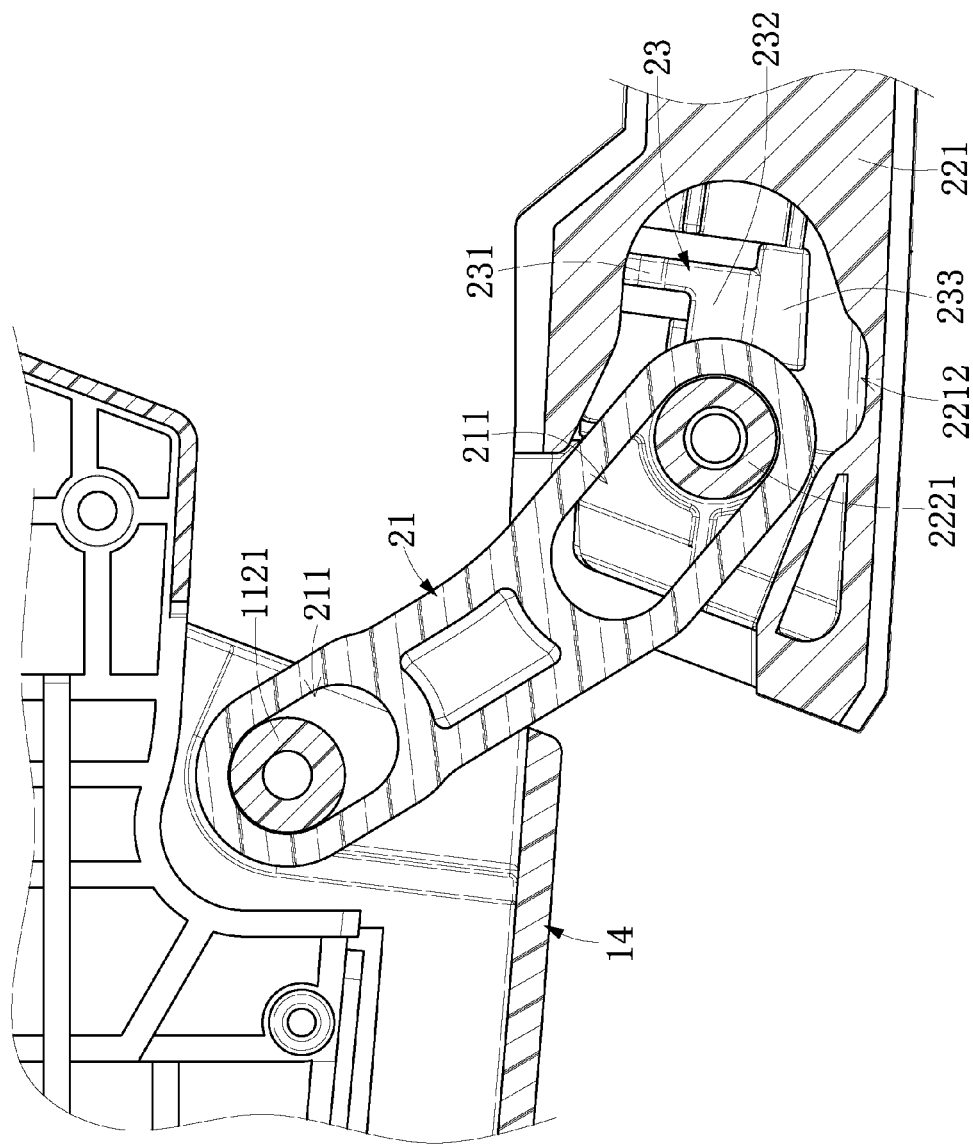
FIG. 16 is a cross-sectional schematic diagram of a handle of a portable computer of the present invention at an open position.
Figure 17:
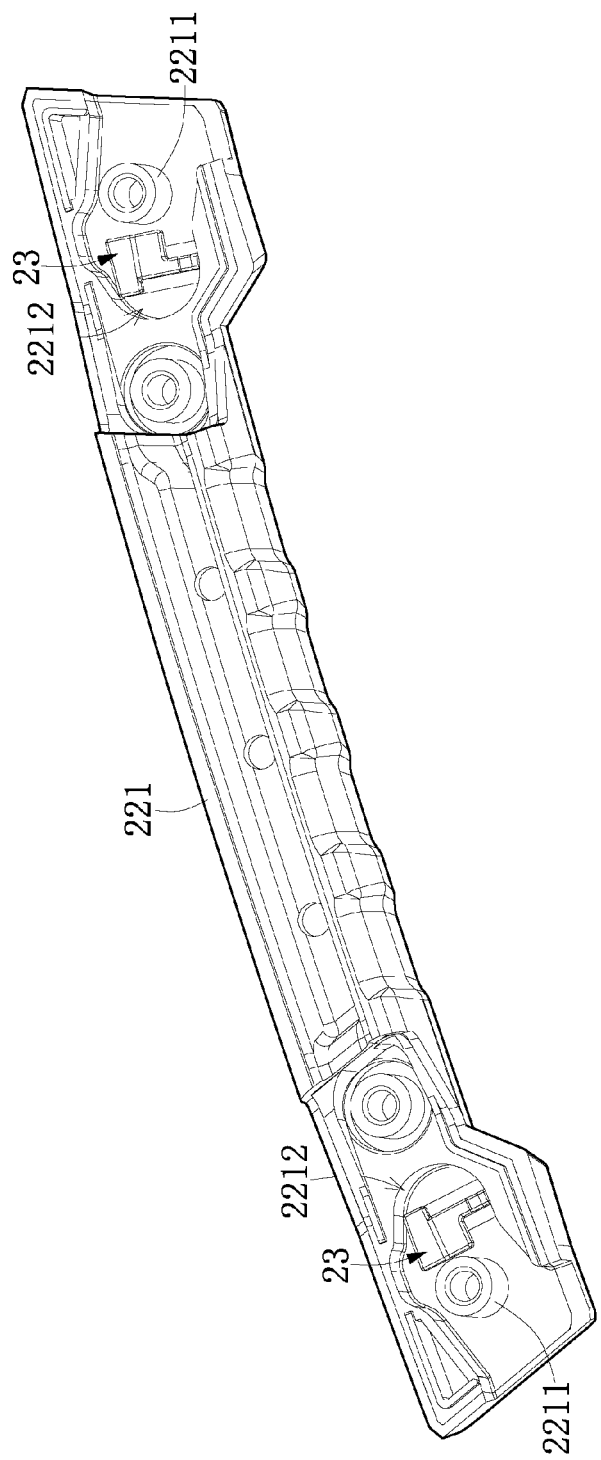
FIG. 17 is a schematic diagram of a handle body and an auxiliary member of a portable computer according to an embodiment of the present invention.

FIG. 16 shows a schematic diagram of a portable computer according to one embodiment of the present invention. This embodiment differs from the foregoing embodiments mainly in that, the auxiliary member 23 may be disposed on an inner side of the handle body 221, and each auxiliary member 23 is not disposed at the end cap as in the foregoing embodiments. Details of the auxiliary member 23 can be referred to the description of the foregoing embodiments, and are omitted herein. In practice, the auxiliary member 23 may be formed on the inner side of the handle body 221 by means of, for example but not limited to, double injection molding.

In this specific embodiment, in order to have the portable computer 100 pass a 6-foot drop test, double injection molding is adopted for the design of the body component 22, wherein a relatively hard plastic material is used for internal mechanisms seeking mechanical strength, and a relatively soft plastic material is used for outer covering elements seeking impact resistance. Specifically, with respect to the end cap 222, the hard structure 2222 of the end cap 222 belongs to an internal mechanism seeking mechanical strength, the first column structure 2221 is integrally formed by means of molding on the hard structure 2222. However, the flexible structure 2223 belongs to an outer covering element seeking impact resistance, and the auxiliary member 23 is integrally formed on the flexible structure 2223 by means of molding and then integrally formed on the yield opening 2222A of the hard structure 2222, so that the auxiliary member 23 can pass through the hard structure 2222 to protrude on the inner side. Thus, when the end cap 222 is assembled to the handle body 221, the auxiliary member 23 made of a soft material can produce an interference fit with the movable member 21. In addition, to similarly allow the portable computer 100 to pass a 6-foot drop test, an assembly seam between the handle body 221 and the end cap 222 is relocated to two sides of the handle body 221, so as to avoid a position of the body component 22 prone to impacts, and the structure of the handle body 221 is seamlessly and integrally formed at this position; that is, a seamless integral structure is formed at a middle section of the handle body 221.

In this specific embodiment, the auxiliary member 23 is abutted against the movable member 21 along the movement path of the movable member 21. Thus, when one end of the movable member 21 having the through hole 211 moves between the handle body 221 and the end cap 222 as the handle 2 moves between a closed position and an open position, the movable member 21 is provided with a clamping force by the interference fit between the auxiliary member 23 made of a soft material and the movable member 21, so that shaking of the movable member 21 is not produced during the entire movement process. Particularly, when the user carries the portable computer 100, the force of gravity generated by the computer body 1 does not result in shaking that is caused by the movable member 21 at the movable member 21 during holding or moving of the user. In this specific embodiment, before the handle 2 is about to return to the closed position, the auxiliary member 23 at the position P provides the movable member 21 with a maximum clamping force; that is, the clamping force is immediately reduced after an interference peak is produced at the position P, thereby generating a feel feedback indicating that the handle 2 has exactly returned to the closed position.

It should be noted that, in a different embodiment, each of the auxiliary members 23 may also be provided on the inner sides (not shown) of respective host shells 14, and disposed between the host shell 14 and the movable member 21. Same as the description of the foregoing embodiments, when the handle 2 is operated to move between the closed position and the open position, the movable member 21 is abutted against the auxiliary member 23. The auxiliary member 23 may be formed by means of, for example but not limited to, double injection molding on the inner side of the host shell 14.

It should be noted that, in practice, the handle 2 may also be made, sold or implemented individually, and the handle 2 is not limited to only being made, sold or implemented together with the portable computer 100.

While the present invention has been described by way of preferred embodiments above, it is to be understood that the present invention is not limited thereto. Equivalent technical modifications made on the basis of the description and drawings of the present invention are to be encompassed within the scope of protection of the present invention.

What is claimed is:

1. A portable computer, comprising:
a computer body; and
a handle, operable to be located at a closed position and an open position relative to the computer body, the handle comprising:
   a body component, for holding by a user;
   a first movable member, one end thereof pivotally connected to the body component and one other end thereof pivotally connected to the computer body; and
   a first auxiliary member, abutted against one side of the first movable member;
   wherein, the handle is arranged such that at all times during a movement process of the handle between the closed position and the open position, at least a portion of the first movable member is kept in contact with the first auxiliary member; and
   wherein, when the handle is at the closed position and the open position, the first auxiliary member and the body component jointly secure the first movable member.

2. The portable computer of claim 1, wherein the first auxiliary member is disposed between the first movable member and the body component, and the first auxiliary member has a recessed portion and a gradual portion, arranged such that when the handle is located at the closed position, a portion of the first movable member is correspondingly located at the recessed portion; and
   wherein a thickness of the first auxiliary member gradually changes at the gradual portion, and the thickness of the gradual portion of the first auxiliary member increases closer to the recessed portion, arranged such that during the movement process of the handle between the closed position and the open position, the first movable member slides at the gradual portion.

3. The portable computer of claim 2, wherein the first auxiliary member further comprises a platform portion, the thickness of the first auxiliary member does not change at the platform portion, a thickness of the platform portion is less than a thickness of the recessed portion at a lowest position, one end of the gradual portion having a larger thickness is connected to the recessed portion, one end of the gradual portion having a smaller thickness is connected to the platform portion, and a thickness of the gradual portion at a position with the smallest thickness is not less than the thickness of the platform portion.

4. The portable computer of claim 1, wherein the handle comprises a second movable member and a second auxiliary member, the body component comprises a handle body and two end caps, the two end caps are detachably disposed on two ends of the handle body, a pivotal structure is formed between the handle body and each of the end caps, one end of each of the first and second movable members is pivotally connected to the pivotal structure, and each of the end caps is provided with one of the first and second auxiliary members.

5. The portable computer of claim 4, wherein each of the end caps comprises a hard structure and a flexible structure, each of the first and second auxiliary members is integrally formed at the flexible structure, the flexible structure envelops a portion of the hard structure, and a hardness of the hard structure is more than a hardness of the flexible structure.

6. A portable computer, comprising:
a computer body; and
a handle, operable to be located at a closed position and an open position relative to the computer body, the handle comprising:
   a body component, for holding by a user;
   a first movable member, one end thereof pivotally connected to the body component and one other end thereof pivotally connected to the computer body; and
   a first auxiliary member, disposed between the first movable member and the computer body, the first auxiliary member abutted against one side of the first movable member;
   wherein, the handle is arranged such that at all times during a movement process of the handle between the closed position and the open position, at least a portion of the first movable member is kept in contact with the first auxiliary member; and
   wherein, when the handle is at the closed position and the open position, the first auxiliary member and the body component jointly secure the first movable member.

7. The portable computer of claim 6, wherein the first auxiliary member has a recessed portion and a gradual portion, arranged such that when the handle is located at the closed position, a portion of the first movable member is correspondingly located at the recessed portion; and
   wherein a thickness of the first auxiliary member gradually changes at the gradual portion, and the thickness of the gradual portion of the first auxiliary member increases as getting closer to the recessed portion, arranged such that during the movement process of the handle between the closed position and the open position, the first movable member slides at the gradual portion.

8. The portable computer of claim 7, wherein the first auxiliary member further comprises a platform portion, the thickness of the first auxiliary member does not change at the platform portion, a thickness of the platform portion is less than a thickness of the recessed portion at a lowest position, one end of the gradual portion having a larger thickness is connected to the recessed portion, one end of the gradual portion having a smaller thickness is connected to the platform portion, and a thickness of the gradual portion at a position with the smallest thickness is not less than the thickness of the platform portion.

9. The portable computer of claim 6, wherein the handle comprises a second movable member and a second auxiliary member, the body component comprises a handle body and two end caps, the two end caps are detachably disposed on two ends of the handle body, a pivotal structure is formed between the handle body and each of the end caps, one end of each of the first and second movable members is pivotally connected to the pivotal structure, and each of the end caps is provided with one of the first and second auxiliary members.

10. The portable computer of claim 9, wherein each of the end caps comprises a hard structure and a flexible structure, each of the first and second auxiliary members is integrally formed at the flexible structure, the flexible structure envelops a portion of the hard structure, and a hardness of the hard structure is more than a hardness of the flexible structure.

11. A handle adapted to be movably mounted to a computer body of a portable computer, the handle operable to be located at a closed position and an open position relative to the computer body, the handle comprising:

a body component, for holding by a user;

a first movable member, one end thereof pivotally connected to the body component and one other end thereof pivotally connected to the computer body; and a first auxiliary member, disposed between the first movable member and the body component, the first auxiliary member abutted against one side of the first movable member;

wherein, the handle is arranged such that at all times during a movement process of the handle between the closed position and the open position, at least a portion of the first movable member is kept in contact with the first auxiliary member; and wherein, when the handle is at the closed position and the open position, the first auxiliary member and the body component jointly secure the first movable member.

12. The handle of claim 11, wherein the first auxiliary member has a recessed portion and a gradual portion, arranged such that when the handle is located at the closed position, a portion of the first movable member is correspondingly located at the recessed portion; and wherein a thickness of the first auxiliary member gradually changes at the gradual portion, and the thickness of the gradual portion of the first auxiliary member increases as getting closer to the recessed portion, arranged such that during the movement process of the handle between the closed position and the open position, the first movable member slides at the gradual portion.

13. The handle of claim 12, wherein the first auxiliary member further comprises a platform portion, the thickness of the first auxiliary member does not change at the platform portion, a thickness of the platform portion is less than a thickness of the recessed portion at a lowest position, one end of the gradual portion having a larger thickness is connected to the recessed portion, one end of the gradual portion having a smaller thickness is connected to the platform portion, and a thickness of the gradual portion at a position with the smallest thickness is not less than the thickness of the platform portion.

14. The handle of claim 11, wherein the handle comprises a second movable member and a second auxiliary member, the body component comprises a handle body and two end caps, the two end caps are detachably disposed on two ends of the handle body, a pivotal structure is formed between the handle body and each of the end caps, one end of each of the first and second movable members is pivotally connected to the pivotal structure, and each of the end caps is provided with one of the first and the second auxiliary members.

15. The handle of claim 14, wherein each of the end caps comprises a hard structure and a flexible structure, each of the first and second auxiliary members is integrally formed at the flexible structure, the flexible structure envelops a portion of the hard structure, and a hardness of the hard structure is more than a hardness of the flexible structure.

16. A portable computer, comprising:

a computer body; and a handle, operable to be located at a closed position and an open position relative to the computer body, the handle comprising:

a body component, for holding by a user;

a movable member, one end thereof pivotally connected to the body component and one other end thereof pivotally connected to the computer body; and an auxiliary member, abutted against one side of the movable member;

wherein, the handle is arranged such that at all times during a movement process of the handle between the closed position and the open position, at least a portion of the movable member is kept in contact with the auxiliary member; and wherein, when the handle is at the closed position and the open position, the auxiliary member and the body component jointly secure the movable member;

wherein the auxiliary member is disposed between the movable member and the body component, and the auxiliary member has a recessed portion and a gradual portion, arranged such that when the handle is located at the closed position, a portion of the movable member is correspondingly located at the recessed portion; and wherein a thickness of the auxiliary member gradually changes at the gradual portion, and the thickness of the gradual portion of the auxiliary member increases closer to the recessed portion, arranged such that during the movement process of the handle between the closed position and the open position, the movable member slides at the gradual portion.

* * * * *